United States Patent
Tomita et al.

(10) Patent No.: US 11,676,662 B2
(45) Date of Patent: Jun. 13, 2023

(54) CROSSBAR ARRAY APPARATUS AND WRITE METHOD THEREOF

(71) Applicant: Winbond Electronics Corp., Taichung (TW)

(72) Inventors: Yasuhiro Tomita, Kanagawa (JP); Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 196 days.

(21) Appl. No.: 17/367,641

(22) Filed: Jul. 6, 2021

(65) Prior Publication Data
US 2022/0013172 A1 Jan. 13, 2022

(30) Foreign Application Priority Data
Jul. 8, 2020 (JP) ............... JP2020-117559

(51) Int. Cl.
*G11C 11/00* (2006.01)
*G11C 11/54* (2006.01)
*G11C 13/00* (2006.01)

(52) U.S. Cl.
CPC .......... *G11C 13/0069* (2013.01); *G11C 11/54* (2013.01); *G11C 13/004* (2013.01);
(Continued)

(58) Field of Classification Search
CPC . G11C 13/0069; G11C 11/54; G11C 13/0026; G11C 13/0028; G11C 13/0038;
(Continued)

(56) References Cited

U.S. PATENT DOCUMENTS 9,269,042 B2  2/2016  Friedman et al.
10,049,732 B2  8/2018  Jeon
(Continued)

FOREIGN PATENT DOCUMENTS

CN  110619907  12/2019
JP  2012203946  10/2012
(Continued)

OTHER PUBLICATIONS

"Office Action of Korea Counterpart Application", dated Sep. 13, 2022, with English translation thereof, pp. 1-9.
(Continued)

*Primary Examiner* — Hien N Nguyen
(74) *Attorney, Agent, or Firm* — JCIPRNET

(57) ABSTRACT

A crossbar array apparatus suppressing deterioration of write precision due to a sneak current is provided. A synapse array apparatus includes a crossbar array configured by connecting resistance-variable type memory elements, a row selecting/driving circuit, a column selecting/driving circuit, and a writing unit performing a write operation to a selected resistance-variable type memory element. The writing unit measures the sneak current generated when applying a write voltage to a selected row line before applying the write voltage, and then the writing unit performs the write operation to the selected resistance-variable type memory element by applying a write voltage having a sum of the measured sneak current and a current generated for performing the write operation.

14 Claims, 9 Drawing Sheets

(52) U.S. Cl.
CPC ...... *G11C 13/0026* (2013.01); *G11C 13/0028* (2013.01); *G11C 13/0038* (2013.01)

(58) Field of Classification Search
CPC .............. G11C 13/004; G11C 2213/72; G11C 13/0007; G11C 2013/0073; G11C 13/0033; G06N 3/063
See application file for complete search history.

(56) References Cited

U.S. PATENT DOCUMENTS

| | | |
|---|---|---|
| 10,755,170 B2 | 8/2020 | Gokmen et al. |
| 2012/0243294 A1 | 9/2012 | Kaneko et al. |
| 2015/0380086 A1* | 12/2015 | Park ................... G11C 13/0004 365/148 |
| 2017/0243642 A1 | 8/2017 | Muralimanohar et al. |
| 2017/0249987 A1 | 8/2017 | Jeon et al. |
| 2017/0271001 A1 | 9/2017 | Muralimanohar et al. |
| 2017/0271004 A1* | 9/2017 | Jeon ................... G11C 13/0033 |
| 2018/0253642 A1 | 9/2018 | Gokmen et al. |
| 2019/0043562 A1 | 2/2019 | Li et al. |
| 2019/0286419 A1 | 9/2019 | Lin et al. |
| 2022/0138546 A1* | 5/2022 | Kwak ................... G06N 3/063 706/33 |

FOREIGN PATENT DOCUMENTS

| | | |
|---|---|---|
| JP | 2021018828 | 2/2021 |
| TW | 201937414 | 9/2019 |

OTHER PUBLICATIONS

"Office Action of Taiwan Counterpart Application", dated Oct. 26, 2021, p. 1-p. 7.
"Office Action of Japan Counterpart Application", dated Jul. 14, 2021, p. 1-p. 7.

* cited by examiner

CROSSBAR ARRAY APPARATUS AND WRITE METHOD THEREOF

CROSS-REFERENCE TO RELATED APPLICATION

This application claims the priority benefit of Japan application serial no. 2020-117559, filed on Jul. 8, 2020. The entirety of the above-mentioned patent application is hereby incorporated by reference herein and made a part of this specification.

BACKGROUND

Technical Field

The disclosure relates to a crossbar array apparatus using resistance-variable type memory elements, and more particularly to a synapse array apparatus that can be used for performing a write operation in a neuron network.

Description of Related Art

Artificial neural network is introduced as a software algorithm in recognition and classification technologies, such as pattern recognition. It has become a necessary technology for configuration by high-integrated digital complementary metal oxide semiconductor (CMOS) technology. The neural network configured by digital technology has gradually reached its limit in terms of power and scale. On the other hand, in recent years, research and development on neural networks using resistive elements as synapses have been undergoing.

From the perspective of integration, a synaptic array using variable resistance elements in a crossbar structure is the best structure. It is particularly desirable to use metal transition oxides, such as hafnium oxide having a high affinity with the CMOS process as the variable resistance element. FIG. 1 illustrates a crossbar array using variable resistance elements. The crossbar array includes multiple row lines 10 extending in the row direction, multiple column lines 20 extending in the row direction in a manner orthogonal to the row lines 10, and resistance-variable type memory elements 30 connected to the row lines 10 and the column lines 20 at each of the crossing portions between the row lines 10 and the column lines 20. The resistance-variable type memory element 30 memorizes different resistance states by applying voltages or currents.

Learning in neural networks is setting the synaptic binding strength to an appropriate value mainly performed by backpropagation algorithm (BPA). The most important part of the backpropagation algorithm is how to finely adjust the synaptic binding strength during learning. However, when the BPA is applied to a crossbar array of highly integrated resistance-variable type memory elements, there is a major problem of deterioration of write prevision of the memory element due to a sneak current.

SUMMARY

The disclosure aims at solving such a problem and provides a crossbar array apparatus suppressing deterioration of write prevision due to a sneak current and a write method thereof. With the write method in the disclosure, a write operation is performed to a crossbar array using a resistance-variable type memory element, and the write method includes the following steps. One step is to measure a sneak current generated when a write voltage is applied to the selected resistance-variable type memory element of the crossbar array. A measurement result of the sneak current is held, and a write current is applied to the selected resistance-variable type memory element. The write current is a sum of a sneak current regenerated according to the held measurement result and the write current set for performing the write operation.

The crossbar array apparatus of the disclosure includes a crossbar array, a row selecting unit, a column selecting unit, and a writing unit. The crossbar array includes multiple row lines, multiple column lines, and resistance-variable type memory elements connected to the row lines and the column lines at each of the crossing portions between the row lines and the column lines. The row selecting unit selects the row lines of the crossbar array. The column selecting unit selects the column lines of the crossbar array. The writing unit performs a write operation to the resistance-variable type memory elements, and the writing unit measures a sneak current generated when a write voltage is applied to a selected resistance-variable type memory element and applies a write current having a sum of a sneak current regenerated according to a measurement result and a write current set for performing the write operation.

According to the disclosure, the sneak current is measured and the sneak current is regenerated according to the measurement result, and the regenerated sneak current is applied as the write current to the selected resistance-variable type memory element, so the influence from the sneak current can be eliminated when the write operation is performed, and the write precision of the resistance-variable type memory element can be more precise. This is especially true for the synaptic crossbar array using resistance-variable type memory elements, and the fine adjustment of synaptic strength can be easily performed even under the influence of the sneak path.

Figure 3:
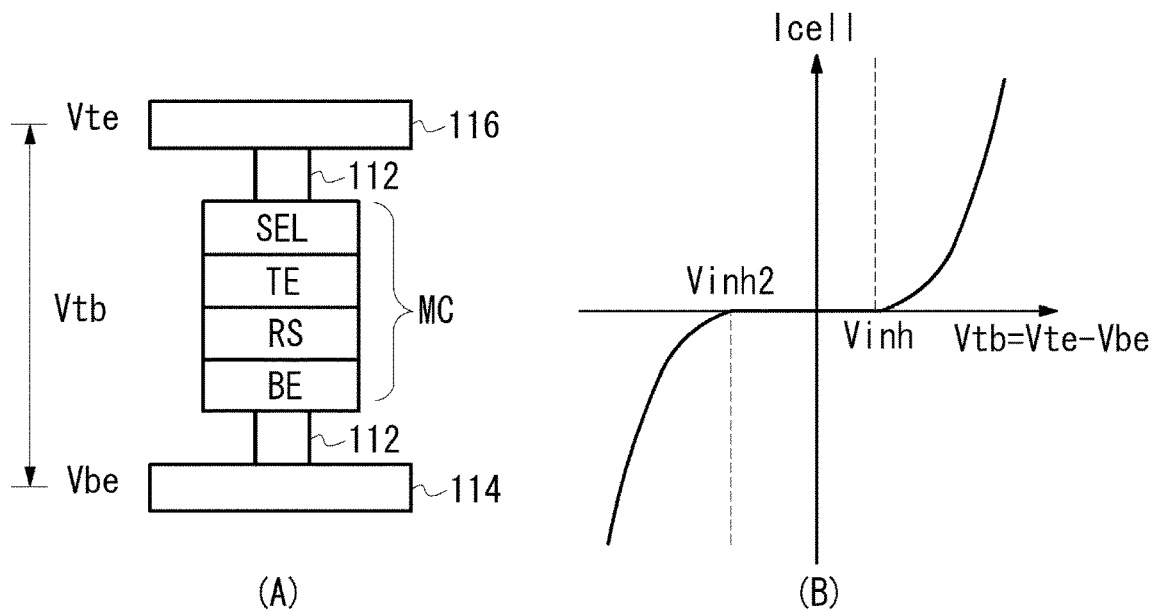

Part (A) of FIG. 3 illustrates the structure of a resistance-variable type memory element according to an embodiment of the disclosure.

Part (B) of FIG. 3 illustrates the I-V characteristics of a selector.

Figure 4:
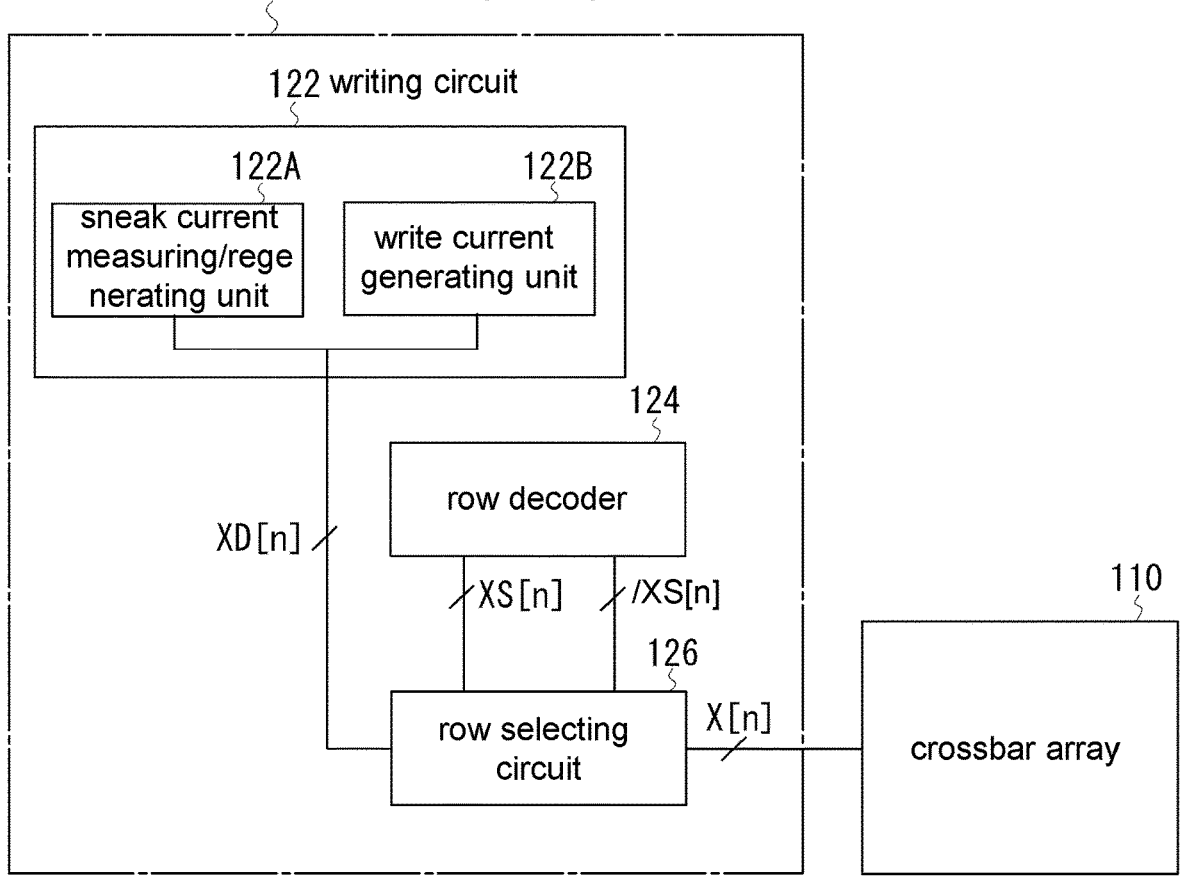

FIG. 4 illustrates the internal structure of a row selecting/driving circuit according to an embodiment of the disclosure.

Figure 5:
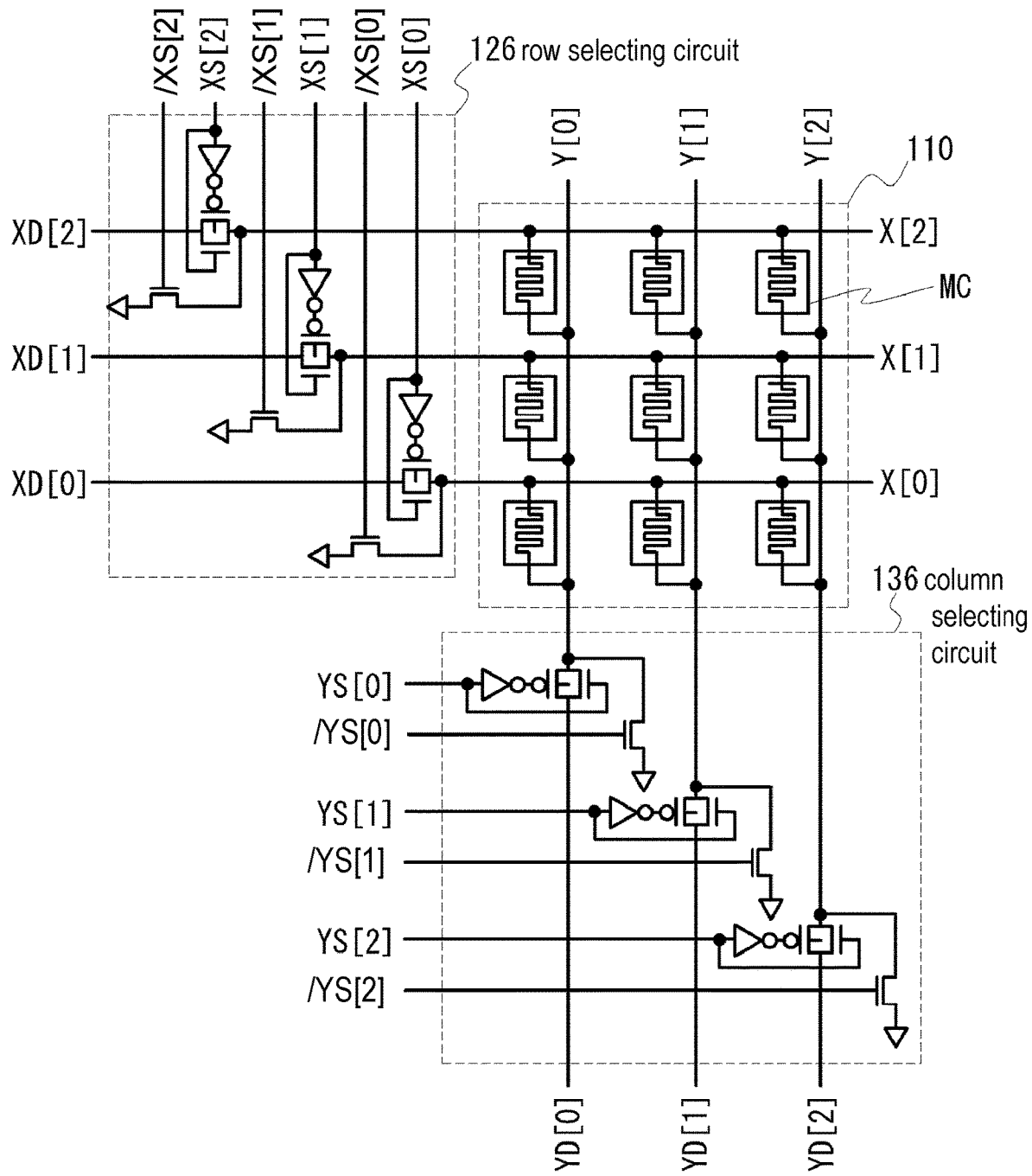

FIG. 5 illustrates a row selecting circuit included in the row selecting/driving circuit and a column selecting circuit included in the column selecting/driving circuit.

Figure 6:
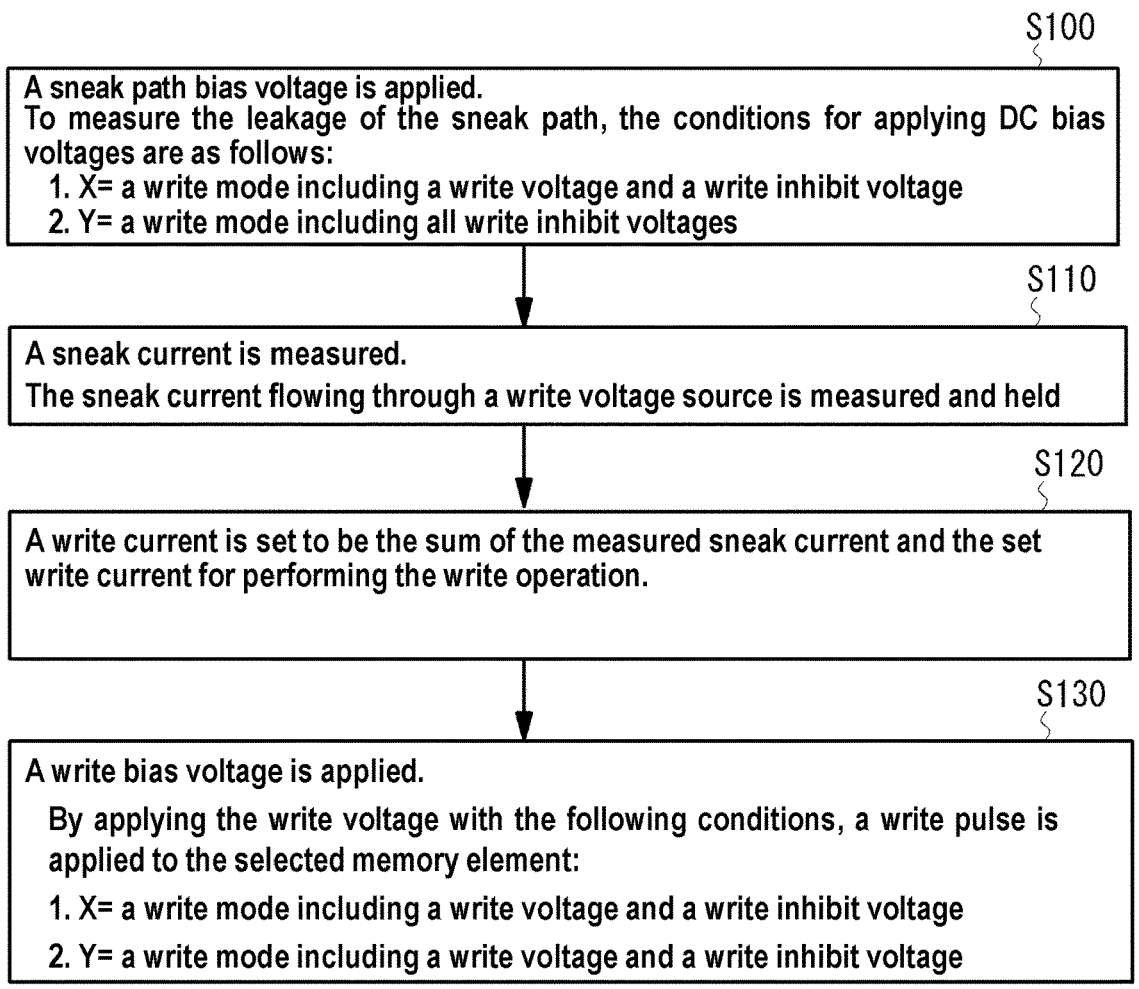

FIG. 6 is a flowchart illustrating a write operation according to an embodiment of the disclosure.

Figure 7A:
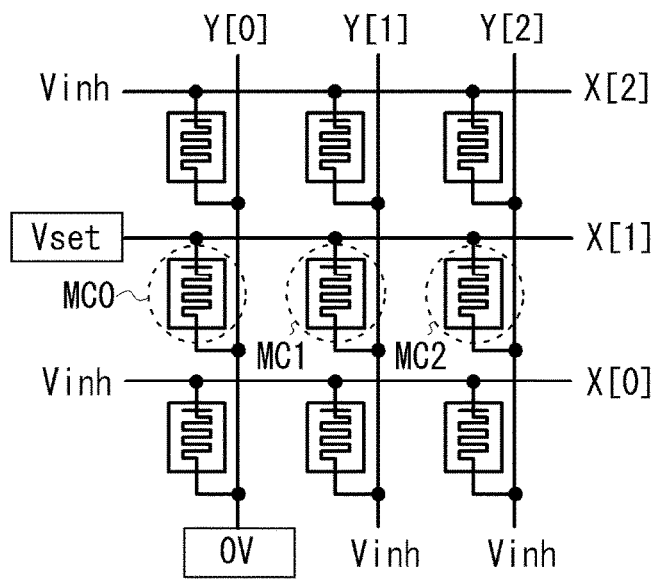

FIG. 7A illustrates a selected resistance-variable type memory element of a crossbar array.

Figure 7B:
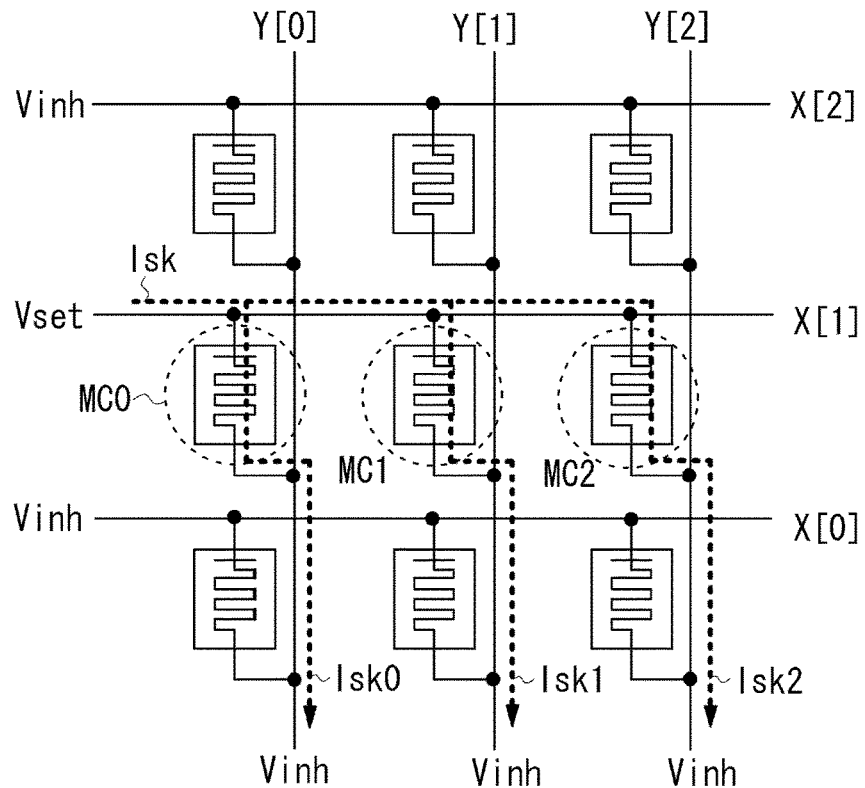

FIG. 7B illustrates a sneak current generated when a write voltage is applied to a row line.

Figure 7C:
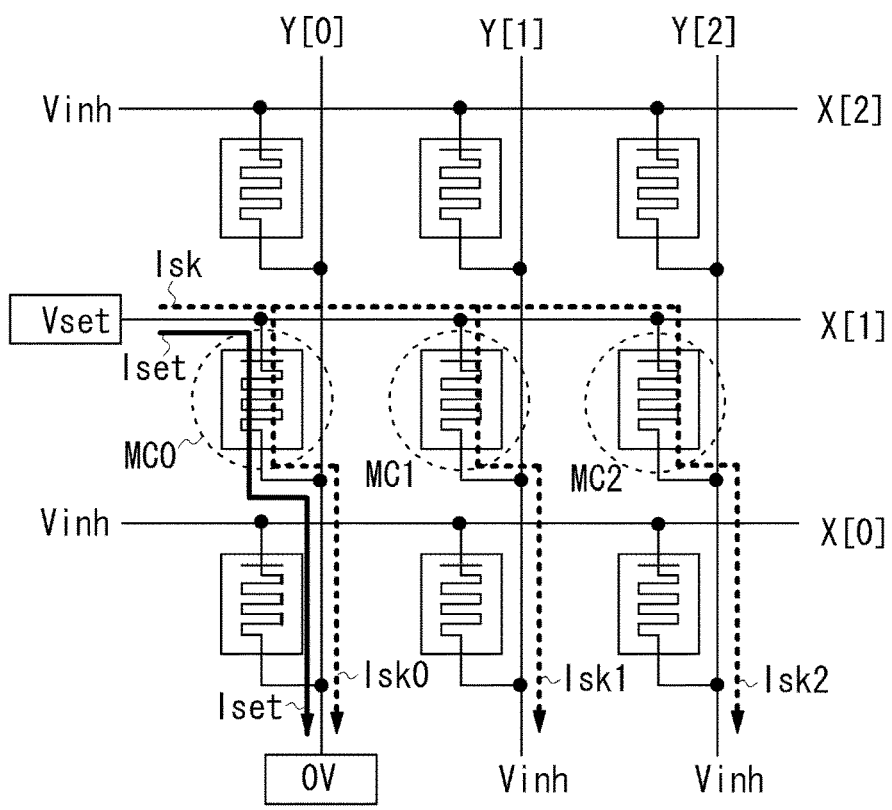

FIG. 7C illustrates an example when a write voltage is applied to a selected resistance-variable type memory element.

Figure 8:
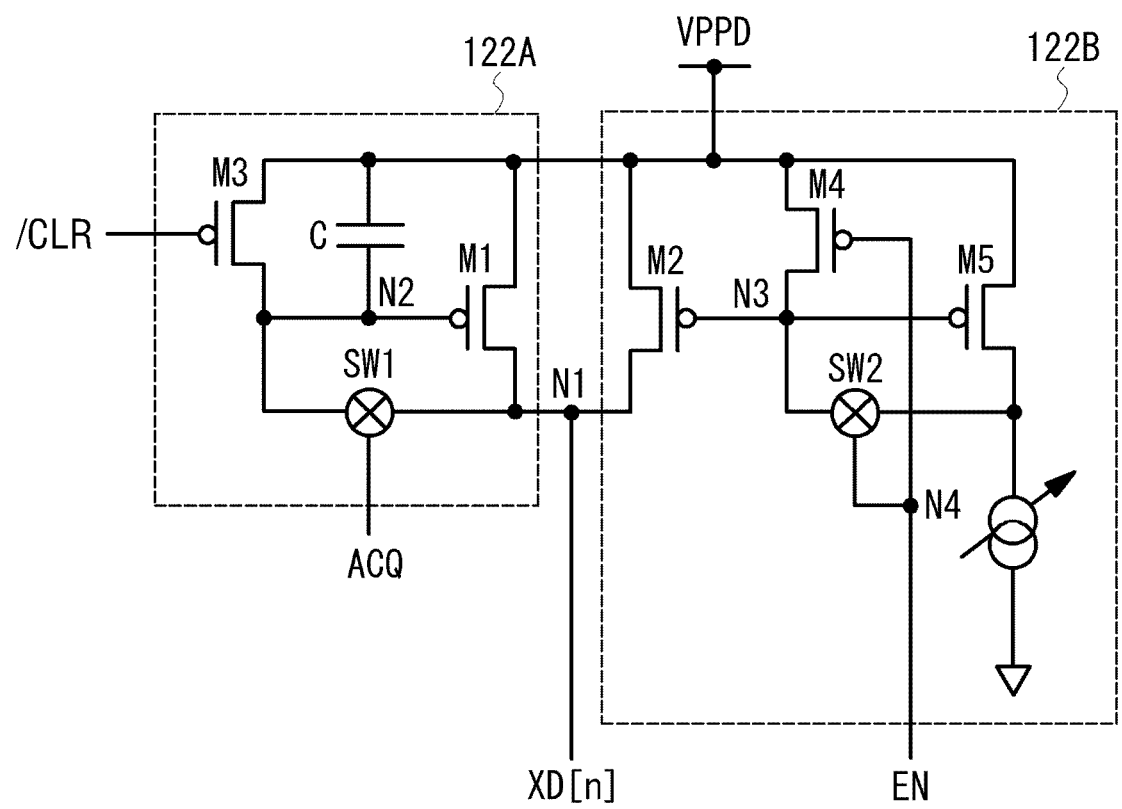

FIG. 8 illustrates a structure of a writing circuit according to an embodiment of the disclosure.

Figure 9:
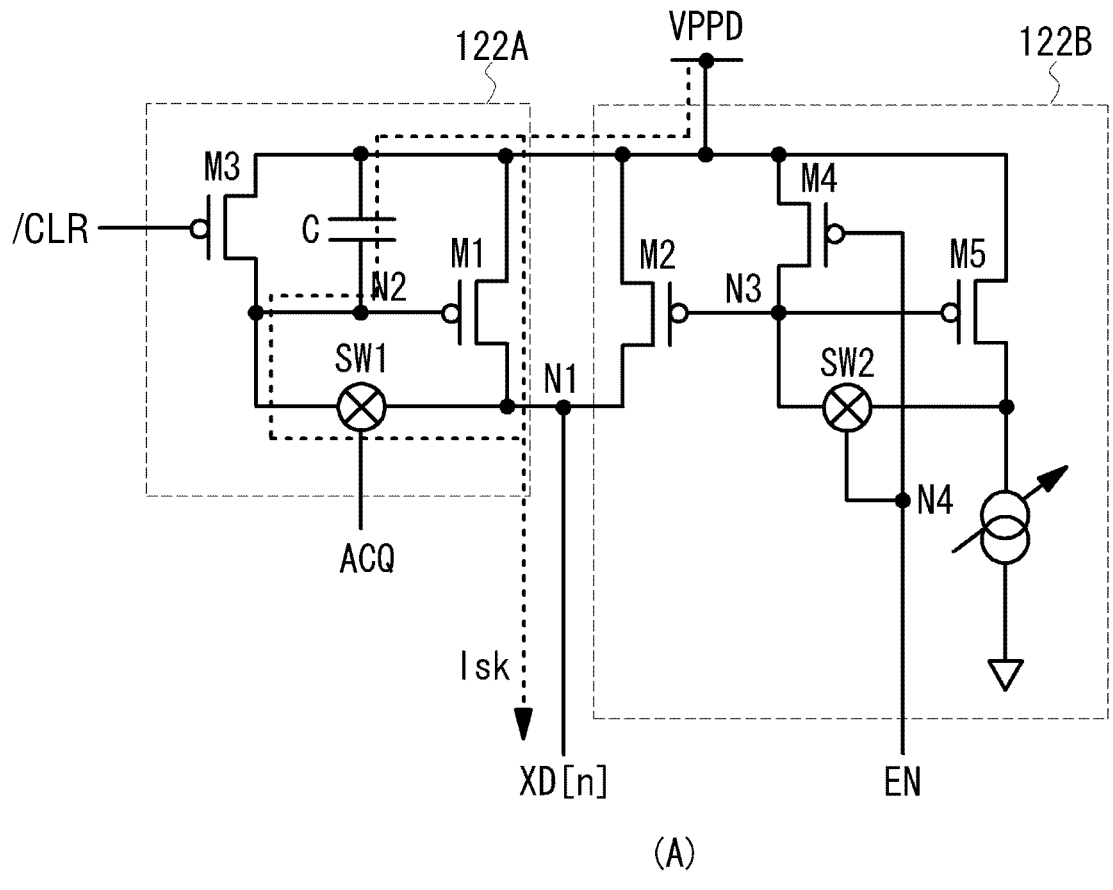

Part (A) to Part (C) of FIG. 9 illustrate an operation when the sneak current is measured in the writing circuit shown in FIG. 8.

Figure 10:
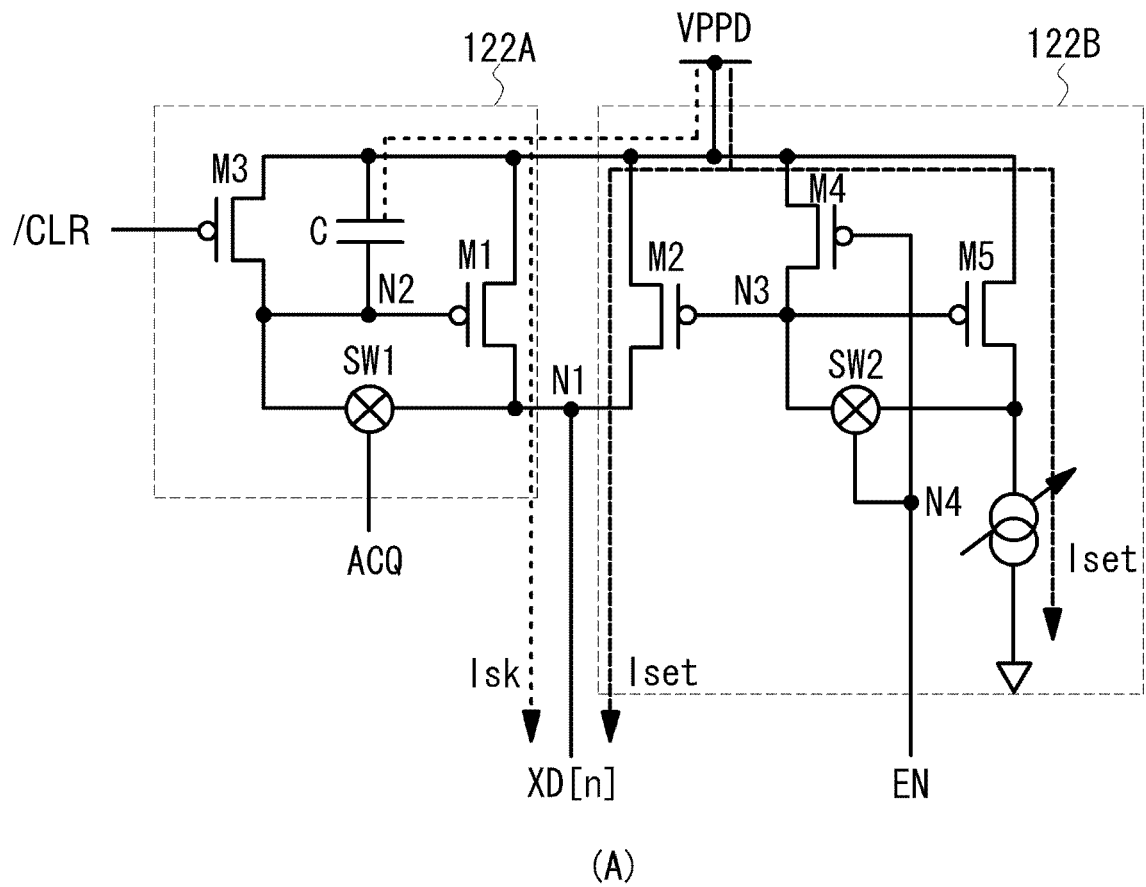

Part (A) to Part (C) of FIG. 10 illustrate an operation when a write voltage is applied to the writing circuit shown in FIG. 8.

Figure 11:
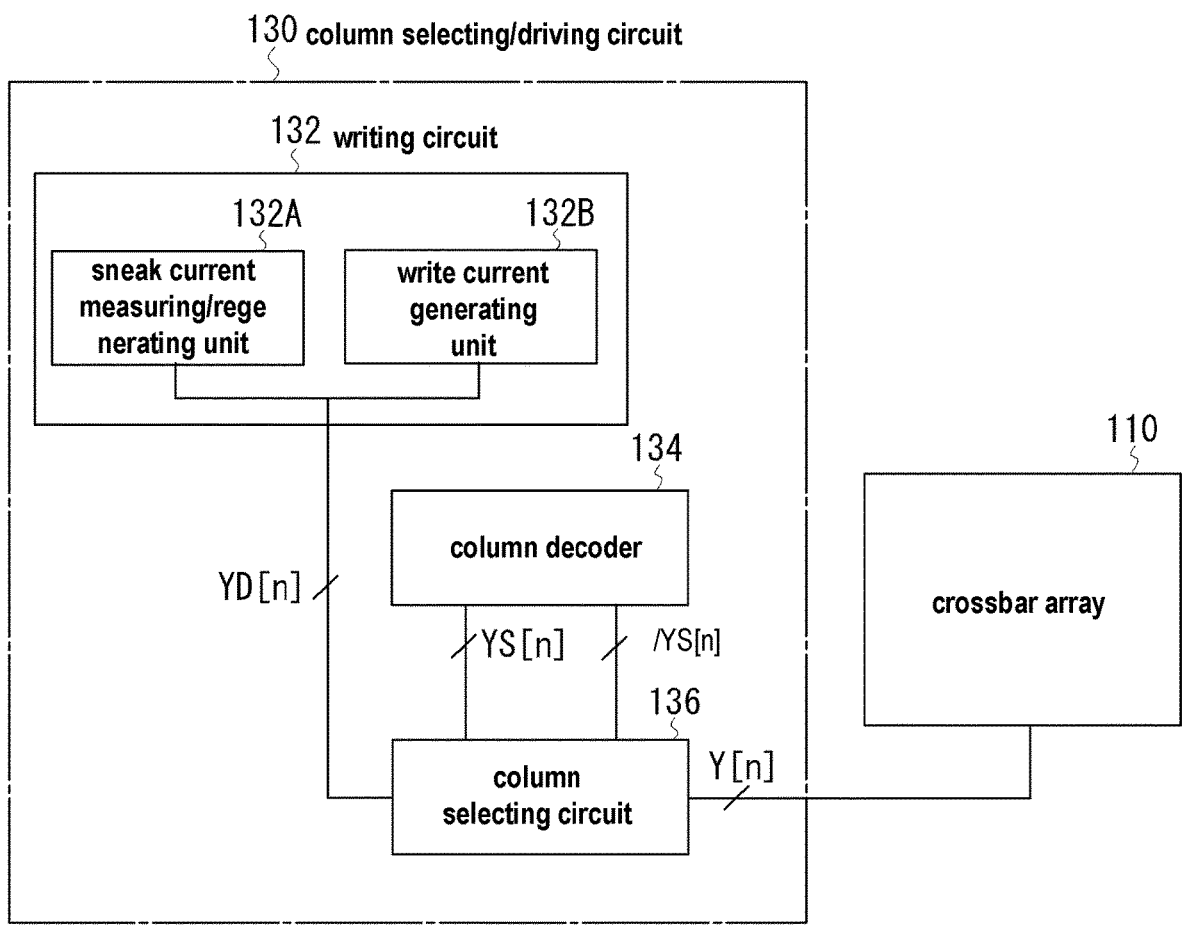

FIG. 11 illustrates the internal structure of a row selecting/driving circuit according to an embodiment of the disclosure.

DESCRIPTION OF THE EMBODIMENTS

The embodiments of the disclosure are illustrated in detail with reference to the drawings. In an embodiment of the disclosure, a crossbar array is used as a synapse array apparatus for forming a neural network. The crossing portion of a matrix of the crossbar array includes a resistance-variable type memory element as a memristor. The resistance-variable type memory element is a bipolar type memory element, which can memorize different conductance states (a high resistance state and a low resistance state) by applying a current or a voltage with different polarities. The resistance-variable type memory element forms a synapse, and the crossbar array forms a synapse array apparatus. The synapse array apparatus is assembled to a computer device or a computer system and responsible for at least part of data processing or algorithm processing performed by a microprocessor, a central processing unit (CPU), or the like. In other embodiments of the disclosure, the crossbar array is used as a multiply-accumulate operation device for forming artificial intelligence (AI) hardware. In the following embodiments, a crossbar array applied to a synapse array apparatus of a neural network is illustrated.

Figure 1:
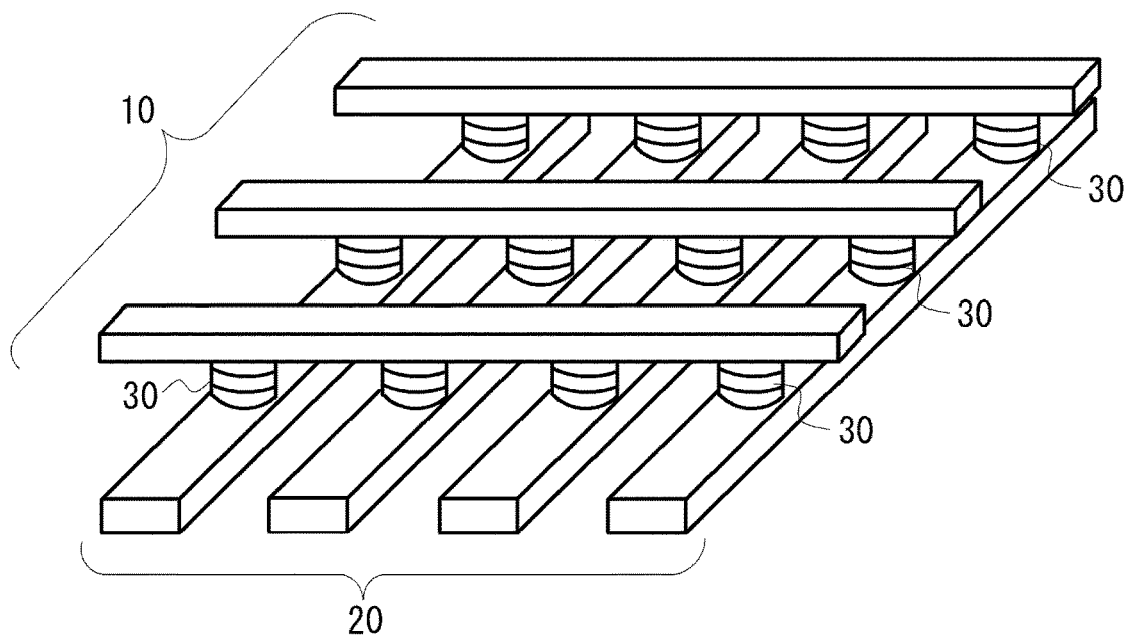
FIG. 1 illustrates a structure of a crossbar array.
Figure 2:
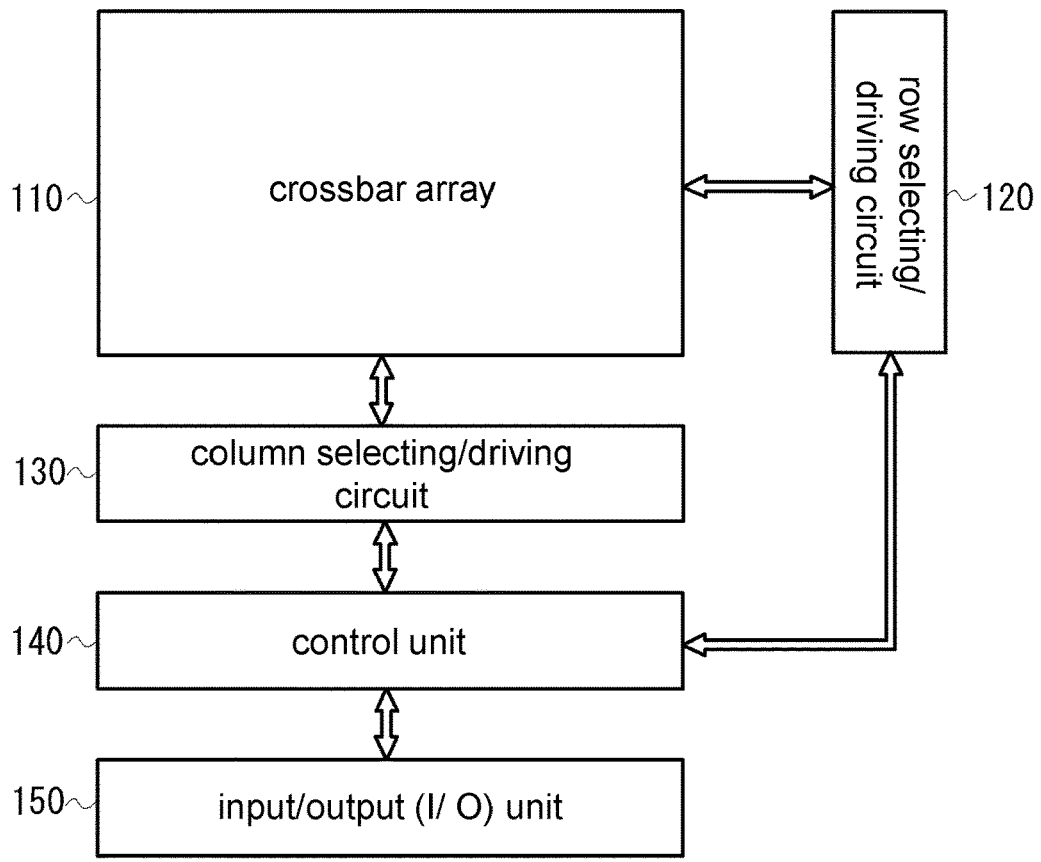
FIG. 2 is a block view illustrating a synapse array apparatus according to an embodiment of the disclosure.

In an array with a high-resistance path, as a means to control a resistance element in a more precise manner, a write operation to control a writing current limit is performed. In the case of a crossbar array, there is a leakage current (a sneak current) caused by a sneak path dependent on an unknown synapse state, and therefore it is difficult to apply a desired current limit to perform the write operation in a more precise manner. In the disclosure, the sneak current is measured before the write pulse is applied, and when the actual write pulse is applied, the measured sneak current is added to the desired current limit for performing the write operation, thereby suppressing the deterioration of write precision due to the sneak current. FIG. 2 is a block view illustrating a configuration example of a synapse array apparatus according to an embodiment of the disclosure. In the embodiment, a synapse array apparatus 100 includes a crossbar array 110 with resistance-variable type memory elements, a row selecting/driving circuit 120, a column selecting/driving circuit 130, a control unit 140, and an input/output (I/O) unit 150. The synapse array apparatus 100 is disposed in an AI chip or a semiconductor integrated circuit, for example.

The crossbar array 110 includes multiple row lines (e.g., lines X) extending in the row direction, multiple column lines (e.g., lines Y) extending in the column direction, and resistance-variable type memory elements connected to the row lines and the row lines at the each of the crossing portions between the row lines and the column lines. For example, the resistance-variable type memory element includes metal transition oxides, such as hafnium oxide (HfOx) or tantalum oxide (TaOx). In an embodiment, each of the resistance-variable type memory elements is integrated with a selector, such as a diode. However, the integration with a selector is not necessary.

Part (A) of FIG. 3 is a schematic cross-sectional view of a resistance-variable type memory element. A resistance-variable type memory element MC includes a resistance switching layer RS containing a metal transition oxide between an upper electrode TE and a lower electrode BE, and a selector SEL is further formed on the upper electrode TE. The lower electrode BE is electrically connected to a lower conductive layer 114 through a via 112, and the selector SEL is connected to an upper conductive layer 116 through the via 112.

Part (B) of FIG. 3 illustrates the I-V characteristics of the selector SEL. The horizontal axis represents a bias voltage Vtb between the upper conductive layer 116 and the lower conductive layer 114 (the upper electrode voltage Vte minus the lower electrode voltage Vbe equals Vtb), and the vertical axis represents a current Icell flowing through the selector SEL. The selector SEL is a bidirectional diode having the following characteristics: a current flows through in the forward direction when the forward bias voltage becomes a certain value or a greater value, and a current flows through in the reverse direction when the reverse bias voltage becomes a certain value or a greater value. Vinh represents a write inhibit voltage or a write protection voltage applied to the row lines and the column lines of the non-selected resistance-variable type memory element when an write operation is set; Vinh2 presents the write inhibit voltage or the write protection voltage applied to the row lines and the column lines of the non-selected resistance-variable type memory element when the write operation is reset. The write inhibit voltage Vinh and the write inhibit voltage Vinh2 are voltages less than a threshold voltage when a current flows through the selector SEL.

Moreover, the quantity, the shape, the conductive material, and the like of the row lines and the column lines of the crossbar array 110 are not limited. In addition, the crossbar array 110 may also be a three-dimensional structure with multiple stacked crossbar arrays in the vertical direction.

The row selecting/driving circuit 120 selects the row lines of the crossbar array 110 based on a row selecting signal or a control signal from the control unit 140 and applies a write voltage, a write inhibit voltage, a read voltage, and the like to the selected row lines. The column selecting/driving circuit 130 selects the column lines of the crossbar array 110 based on a column selecting signal or a control signal from the control unit 140 and applies a write voltage, a write inhibit voltage, a read voltage, and the like to the selected column lines. Moreover, the resistance-variable type memory element is a bipolar type memory element. In the embodiment, the write operation of applying a bias voltage from the row line to the column line is set as a set write operation, and the write operation of applying a bias voltage from the column line to the row line is set as a reset write operation.

When the set write operation is performed, the row selecting/driving circuit 120 applies a set write operation voltage (a positive voltage) to the row line connected to the selected resistance-variable type memory element and a write inhibit voltage (a positive voltage) to the row line connected to the non-selected resistance-variable type memory element; and the column selecting/driving circuit 130 applies a set write voltage (0 V) to the column line connected to the selected resistance-variable type memory element and a write inhibit voltage (a certain positive voltage) to the column line connected to the non-selected resistance-variable type memory element.

When the reset write operation is performed, the column selecting/driving circuit 130 applies a reset write voltage (a positive voltage) to the column line connected to the selected resistance-variable type memory element and a write inhibit voltage (a positive voltage) to the column line connected to the non-selected resistance-variable type memory element; and the row selecting/driving circuit 120 applies a reset write voltage (0 V) to the row line connected to the selected resistance-variable type memory element and a write inhibit voltage (a certain positive voltage) to the row line connected to the non-selected resistance-variable type memory element.

The control unit 140 is composed of hardware and/or software and controls the read operations, the write operations, or other calculations (e.g., multiply-accumulate operations of a matrix). In a certain embodiment, the control unit 140 includes a microcontroller with read-only memory/random access memory (ROM/RAM), a microprocessor, a state machine, or the like; and the control unit 140 controls the read operation or the write operation by executing the software stored in ROM/RAM, for example. Moreover, the controller 140 may include a sensing circuit. The sensing circuit senses the voltage or the current of the column or the row selected by the row selecting/driving circuit 120 or the column selecting/driving circuit 130 when the read operation is performed.

The input/output unit 150 is connected to the control unit 140 through an internal data bus, for example. The input/output unit 150 also provides the control unit 140 with data received from the outside or outputs data received from the control unit 140 to the outside. The control unit 140 can obtain data for performing the write operation to the resistance-variable type memory element MC from the input/output unit 150.

FIG. 4 illustrates the internal structure of the row selecting/driving circuit 120. The row selecting/driving circuit 120 includes a writing circuit 122, a row decoder 124, and a row selecting circuit 126. The writing circuit 122 generates a driving signal XD[n] for applying a set write voltage to the selected resistance-variable type memory element when the write operation is performed. The row decoder 124 decodes a row address from the control unit 140 or the input/output unit 150 and generates a row selecting signal XS[n] and a row selecting signal/XS[n]. The row selecting circuit 126 receives the driving signal XD[n] from the writing circuit 122, and based on the row selecting signal XS[n] and the row selecting signal/XS[n] from the row decoder 124, the driving signal XD[n] is connected to the row line X[n] of the crossbar array 110.

The writing circuit 122 further includes a sneak current measuring/regenerating unit 122A and a write current generating unit 122B. The sneak current measuring/regenerating unit 122A measures the sneak current generated by the set write voltage before applying the set write pulse to the resistance-variable type memory element, the measurement result is held, and the sneak current is regenerated according to the held measurement result. The write current generating unit 122B generates a write current for performing the set write operation under the control of a current limiter (a limiter). When the set write operation is performed, the sneak current measuring/regenerating unit 122A measures the sneak current generated by the set write voltage first, and the measurement result is held. When the write operation is performed to the selected resistance-variable type memory element, the sneak current measuring/regenerating unit 122A regenerates the sneak current according to the measurement result, the write current generating unit 122B generates a write current based on the current limiter, and the writing circuit 122 applies a write current that is the sum of the regenerated sneak current and the write current based on the current limiter to the resistance variable memory element. The applied write current includes the sneak current, so the write current that compensates for the sneak current is applied to the resistance-variable type memory element, and the write operation of the resistance-variable type memory element can be performed in a more precise manner (i.e., the fine adjustment of the conductance).

FIG. 5 illustrates a structure in which the row selecting circuit 126 is included in the row selecting/driving circuit 120 and a column selecting circuit 136 is included in the column selecting/driving circuit 130. In FIG. 5, an array of 3 rows×3 columns is illustrated as a part of the crossbar array 110. Meanwhile, the row direction is X, and the column direction is Y. Corresponding to each of the row lines, the row selecting circuit 126 includes a CMOS pass transistor for inputting the driving signal XD[n] generated by the writing circuit 122, an inverter for inputting the row selecting signal XS[n] generated by the row decoder 124, and an NMOS transistor to which the row selecting signal/XS[n] is applied at the gate. When the row selecting signal XS[n] is at an H level, the CMOS pass transistor is turned on, the driving signal XD[n] is applied to the row line X[n], and the NMOS transistor is turned off. When the row selecting signal XS[n] is at an L level, the CMOS pass transistor is turned off, the NMOS transistor is turned on, and the row line X[n] is connected to a GND level. By switching the row selecting signal XS[n] and the row selecting signal/XS[n], the pulse of the driving signal XD[n] is applied to the resistance-variable type memory element through the row line X[n].

Corresponding to each of the column lines, the column selecting circuit 136 includes a CMOS pass transistor for inputting a driving signal YD[n] generated by a writing circuit not shown, an inverter for inputting a column selecting signal YS[n] generated by a column decoder not shown, and an NMOS transistor to which a column selecting signal/YS is applied at the gate. When the column selecting signal YS[n] is at the H level, the CMOS pass transistor is turned on, the driving signal YD[n] is applied to the column line Y[n], and the NMOS transistor is turned off. When the column selecting signal YS[n] is at the L level, the CMOS pass transistor is turned off, the NMOS transistor is turned on, and the column line Y[n] is connected to the GND level. By switching the column selecting signal YS[n] and a column selecting signal/YS[n], the pulse of the driving signal YD[n] is applied to the resistance-variable type memory element through the column line Y[n].

The write operation of the synapse array apparatus 100 in the embodiment is illustrated in the following paragraphs. FIG. 6 is a flowchart illustrating the write operation of the embodiment. In FIG. 7A, an array of 3 rows×3 columns is illustrated as a part of the crossbar array 110, and an example of performing the set write operation to a resistance-variable type memory element MC0 at the crossing portion of a row line X[1] and a column line Y[0] is illustrated herein.

First, a sneak path bias voltage is applied to the array (step S100). The sneak path bias voltage is a direct current (DC) bias voltage used to measure the sneak current and has a write mode including a write voltage and a write inhibit voltage applied to the row line, and a write mode including all write inhibit voltages applied to the column line. FIG. 7A to FIG. 7C illustrate an example when the sneak path bias voltage is applied. A write voltage Vset is applied to the row line X[1] connected to the selected resistance-variable type memory element MC0, and the write inhibit voltage Vinh is applied to the row lines X[0] and X[2] other than the row line X[1]. The write modes are generated by the writing circuit 122. That is, the writing circuit 122 connected to the row line X[1] generates the write voltage Vset, and the writing circuit 122 connected to the row line X[0] and the row line X[2] generates the write inhibit voltage Vinh. Moreover, the column selecting/driving circuit 130 applies the write inhibit voltage Vinh to all column lines Y[0], Y[1], and Y[2].

Next, the sneak current at the time when the sneak path bias voltage is applied is measured (step S110). As shown in FIG. 7B, when the write voltage Vset is applied to the row line X[1], accordingly a sneak current (a leakage current) is generated. The row line X[1] is connected to the column line Y[0], the column line Y[1], and the column line Y[2] through the resistance-variable type memory element MC0, a resistance-variable type memory element MC1, and a resistance-variable type memory element MC2, and thereby a sneak current Isk0, a sneak current Isk1, and a sneak current Isk2 (represented by the dashed line) flowing in the paths can be generated. The magnitude of the sneak current Isk0, that of the sneak current Isk1, and that of the sneak current Isk2 depend on the voltage difference (Vset−Vinh) in the sneak paths and the resistance states (conductance states) of the resistance-variable type memory element MC0, the resistance-variable type memory element MC1, and the resistance-variable type memory element MC2. Moreover, when the set write operation of the resistance-variable type memory element MC0 is performed, the resistance states of the resistance-variable type memory element MC0, the resistance-variable type memory element MC1, and the resistance-variable type memory element MC2 are unknown. Therefore, a sneak current Isk (Isk=Isk0+Isk1+Isk2) is an unknown variable, which is difficult to predict. Therefore, in the embodiment, the sneak current Isk generated by the write voltage Vset is measured by the sneak current measuring/regenerating unit 122A.

Next, the write current for applying the write pulse is set (step S120). The write pulse is the sum of the sneak current Isk and a write current Iset set for performing the write operation. Specifically, the sneak current measuring/regenerating unit 122A regenerates or restores the sneak current Isk according to a measurement result, the write current generating unit 122B generates the write current Iset set for performing the write operation by the current limiter, and the sum of the sneak current Isk and the write current Iset is a set write current pulse.

Next, a write bias voltage is applied (step S130). As shown in FIG. 7C, the write voltage Vset is applied to the row line X[1], and the write inhibit voltage Vinh is applied to the row line X[0] and the row line X[2]. On the other hand, the GND voltage is applied to the column line Y[0], and the write inhibit voltage Vinh is applied to the column line Y[1] and the column line Y[2]. According to the above, a total current of the sneak current Isk regenerated by the sneak current measuring/regenerating unit 122A and the write current Iset generated by the write current generating unit 122B is applied to the row line X[1]. Accordingly, a write current (Isk+Iset) that compensates for the sneak current Isk1 and the sneak current Isk2 is applied to the resistance-variable type memory element MC0.

The structure of the writing circuit 122 in the embodiment is illustrated in FIG. 8. The writing circuit 122 shown in FIG. 8 is a driving circuit that performs a write current control, the sneak current measuring/regenerating unit 122A performs sampling/holding of the sneak current Isk, and the write current generating unit 122B includes a current limiter for generating the write current Iset. The current limiter can be variable in accordance with the data when the set write operation is performed, for example.

The sneak current measuring/regenerating unit 122A includes a PMOS transistor M1, a capacitor C, a PMOS transistor M3, and an analog switch SW1. The PMOS transistor M1 is connected between a voltage source VPPD and a node N1. The capacitor C and the PMOS transistor M3 are connected in parallel between a node N2 and the voltage source VPPD, and the node N2 is connected to the gate of the PMOS transistor M1. The analog switch SW1 is connected between the node N1 and the node N2, connected to a clear signal/CLR at the gate of the PMOS transistor M3, and connected to a control signal ACQ. The analog switch SW1 is on when the control signal ACQ is at the H level, and the analog switch SW1 is off when the control signal ACQ is at the L level. The node N1 is connected to the corresponding driving signal XD[n].

The write current generating unit 122B includes a PMOS transistor M2, a PMOS transistor M4, an analog switch SW2, a PMOS transistor M5, and a constant current source. The PMOS transistor M2 is connected between the voltage source VPPD and the node N1. The PMOS transistor M4 is connected between the voltage source VPPD and a node N3. The analog switch SW2 is connected between the node N3 and a node N4. The PMOS transistor M5 and the constant current source are connected in series between the voltage source VPPD and a GND. The constant current source sets the current limit, which can vary in accordance with the data of the set write operation, for example. The node N4 is connected to an enabling signal EN. When the enabling signal EN is at the L level, the analog switch SW2 is off, the PMOS transistor M4 is on, the PMOS transistor M2 and the PMOS transistor M5 are off, and the write current generating unit 122B is disabled. When the enabling signal EN is at the H level, the analog switch SW2 is off, the node N3 becomes the L level, the PMOS transistor M2 and the PMOS transistor M5 are on, and the write current generating unit 122B is enabled. The PMOS transistor M2 and the PMOS transistor M5 form a current mirror circuit, and a current set by the constant current source is generated as the write current at the node N1 through the PMOS transistor M2.

When measuring the sneak current, the sneak path bias voltage is applied according to the above description (S100) to measure the sneak current. When the sneak current is measured, the control unit 140 applies the bias voltage shown in part (B) of FIG. 9 to the writing circuit 122. The write current generating unit 122B is disabled due to the enabling signal EN, and the PMOS transistor M2 is off. When the sneak current Isk flows to the driving signal XD[n], the PMOS transistor M1 is an MOS diode, the sneak current Isk is converted to a gate voltage of the MOS diode which is held in the capacitor C as an electrostatic capacitance. The numeral reference $I_{XD}$ shown in part (C) of FIG. 9 is the current of the driving signal XD[n].

After measuring/holding the sneak current Isk, the bias voltage at the time when the set write operation is performed is applied to the selected memory element. At this time, the control unit 140 applies the bias voltage shown in part (B) of FIG. 10 to the writing circuit 122. The analog switch SW1 is off, the MOS diode becomes an open circuit, the charge held in the capacitor C is discharged, the sneak current acts as a regenerated current source, and the sneak current Isk is copied to the node N1. Moreover, the write current generating unit 122B is in the disabling state, the PMOS transistor M2 and the PMOS transistor M5 are on, and the write current Iset set by the constant current source is generated at the node N1. Accordingly, the current $I_{XD}$ of the driving signal XD[n] becomes the sum of the sneak current Isk and the write current Iset. When the set write operation is performed to the selected resistance-variable type memory element MC0, the influence from the sneak current Isk1 and the sneak current Isk2 can be eliminated.

According to the embodiment, when the write operation is performed, the sneak current is measured, the write current pulse to which the measured sneak current is added is applied to the resistance-variable type memory element, and thereby the influence caused by the sneak current is suppressed, so that the write precision of the resistance-variable type memory element is improved.

When the sneak current is measured, the measurement result is held, and the operation of applying the write pulse that is the sum of the held measurement result and the current corresponding to the desired write data is performed, relative to a path, for a larger analogy, an analog to digital converter (ADC), a digital to analog converter (DAC), memory, and logic gate wait for a larger analogy are required. However, in the embodiment the writing circuit can be configured by a simple analog circuit.

In the described embodiment, the same transistor is used for the sampling of the sneak current and the regeneration of the sneak current, so the threshold value of the transistor or the deviation of the process/voltage/temperature of the drain current can be eliminated. This can be effectively applied to a low-cost, low-power, and large-scale synaptic crossbar array apparatus.

In a synapse array apparatus using resistive elements in a crossbar array, the selector elements shown in part (A) of FIG. 3 and part (B) of FIG. 3(B) are required to reduce the influence of the sneak path. However, in the disclosure, the write current pulse compensates for the sneak current, so the synapse strength (resistance change of the resistance-variable type memory element) can be easily finely adjusted without the required selector. Meanwhile, the same effect can be naturally applied to a resistance-variable type memory element integrated with the selector.

In the embodiments, it is illustrated that the sneak current is measured when the write operation is performed, but the sneak current may also be measured at intervals. For example, the measurement may be performed at a certain frequency of the write operation or at certain predetermined time intervals.

Regarding the voltage dependence of the resistance change of the resistance-variable type memory element using a metal transition oxide, such as hafnium oxide, the voltage dependence becomes relatively large when the set write operation is performed compared to that when the reset write operation is performed. Therefore, the measurement and the elimination of the sneak current is particularly effective in the set write operation when the set write operation is performed as in the foregoing embodiment. However, the disclosure is also applicable to the reset write operation for sure. In the reset write operation, as shown in FIG. 11, the column selecting/driving circuit 130 includes a writing circuit 132, a column decoder 134, and the column selecting circuit 136. Similar to the row selecting/driving circuit 120, the writing circuit 132 includes a sneak current measuring/regenerating unit 132A and a write current generating unit 132B. The writing circuit 132 measures the sneak current generated when the reset write voltage is applied before applying the reset write pulse, the sneak current is regenerated based on the measurement result, and the sum of the regenerated sneak current and the write current Ireset set for performing the reset write operation is applied to the selected row or the selected memory element.

In the embodiment, it is illustrated that a crossbar array is applied to a synaptic array, but the disclosure is not limited thereto. The write method of the crossbar array in the embodiment can also be applied to other devices (e.g., memory, computing logic, and the like).

The embodiments of the disclosure have been described in detail, but the disclosure is not limited to specific embodiments. Various modifications and changes may be made within the scope of the spirit of the disclosure described in the appended claims.

What is claimed is:

1. A write method for a crossbar array, wherein a write operation is performed to a crossbar array using a resistance-variable type memory element, and the write method comprises:
   measuring a sneak current generated when a write voltage is applied to the selected resistance-variable type memory element of the crossbar array;
   holding a measurement result of the sneak current; and
   applying a write current to the selected resistance-variable type memory element, wherein the write current is a sum of a sneak current regenerated according to the held measurement result and the write current set for performing the write operation.

2. The write method according to claim 1, wherein the measuring step comprises applying a bias voltage mode including the write voltage and a write inhibit voltage to row lines or column lines, and applying a bias voltage mode including the write inhibit voltage to all the row lines or all the row lines.

3. The write method according to claim 1, wherein the step of applying the write voltage comprises applying the write voltage to row lines and column lines connected to the selected resistance-variable type memory element, and applying a write inhibit voltage to row lines and column lines connected to the non-selected resistance-variable type memory element.

4. The write method according to claim 1, wherein the holding step comprises holding a sneak current flowing through a write voltage source as an electrostatic capacitance in a capacitor, and the step of applying the write voltage comprises regenerating the sneak current according to the electrostatic capacitance held in the capacitor.

5. The write method according to claim 1, wherein the write operation is a set write operation for shifting a state of the resistance-variable type memory element to a low resistance state.

6. A crossbar array apparatus, comprising a crossbar array comprising a plurality of row lines, a plurality of column lines, and resistance-variable type memory elements connected to the row lines and the column lines at each of crossing portions between the plurality of the row lines and the plurality of the column lines;
   a row selecting unit selecting the row lines of the crossbar array;
   a column selecting unit selecting the column lines of the crossbar array; and
   a writing unit performing a write operation to the resistance-variable type memory elements,
   wherein the writing unit measures a sneak current generated when a write voltage is applied to a selected resistance-variable type memory element and applies a write current comprising a sum of a sneak current regenerated according to a measurement result and a write current set for performing the write operation.

7. The crossbar array apparatus according to claim 6, wherein when the sneak current is measured, the row selecting unit or the column selecting unit applies a bias voltage mode including the write voltage and a write inhibit voltage to the row lines or the column lines, and the column selecting unit or the row selecting unit applies a bias voltage mode including the write inhibit voltage to all the column lines or all the row lines.

8. The crossbar array apparatus according to claim 6, wherein when the write current comprising the sum is applied, the row selecting unit or the column selecting unit applies the write voltage to a row line and a column line connected to the selected resistance-variable type memory element, and a write inhibit voltage is applied to a row line and a column line of a non-selected resistance-variable type memory element.

9. The crossbar array apparatus according to claim 6, wherein the writing unit comprises a measuring/regenerating circuit, and the measuring/regenerating circuit measures the sneak current and holds the measurement result of the sneak current.

10. The crossbar array apparatus according to claim 9, wherein the measuring/regenerating circuit holds a sneak current flowing through a write voltage source as an electrostatic capacitance in a capacitor and regenerates the sneak current based on the electrostatic capacitance held in the capacitor.

11. The crossbar array apparatus according to claim 10, wherein the measuring/regenerating circuit comprises a metal oxide semiconductor transistor connected to the write voltage source and the capacitor connected between a gate of the metal oxide semiconductor transistor and the write voltage source.

12. The crossbar array apparatus according to claim 6, wherein the writing unit comprises a current limiter generating a certain current by a constant current source, and the write current is set according to the constant current source which is variable.

13. The crossbar array apparatus according to claim 6, wherein each of the resistance-variable type memory elements is integrated with a selector, and a current flows through when the selector applies a voltage greater than a threshold voltage in a forward bias voltage and in a reverse bias voltage.

14. The crossbar array apparatus according to claim 6, wherein the crossbar array is applied to a synapse array.

* * * * *